United States Patent
Kimura et al.

(10) Patent No.: US 8,680,744 B2
(45) Date of Patent: Mar. 25, 2014

(54) SURFACE ACOUSTIC WAVE DEVICE

(71) Applicant: Murata Manufacturing Co., Ltd., Nagaokakyo (JP)

(72) Inventors: Tetsuya Kimura, Nagaokakyo (JP); Michio Kadota, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/944,906

(22) Filed: Jul. 18, 2013

(65) Prior Publication Data

US 2013/0300253 A1 Nov. 14, 2013

Related U.S. Application Data

(63) Continuation of application No. PCT/JP2012/050764, filed on Jan. 17, 2012.

(30) Foreign Application Priority Data

Jan. 19, 2011 (JP) ................................. 2011-008369

(51) Int. Cl.
    *H01L 41/08* (2006.01)
(52) U.S. Cl.
    USPC .................................. 310/313 B; 319/313 R
(58) Field of Classification Search
    USPC .......................................... 310/313 R, 313 B
    See application file for complete search history.

(56) References Cited

U.S. PATENT DOCUMENTS 8,169,121 B2 * 5/2012 Kimura et al. ............ 310/313 B
8,183,737 B2 * 5/2012 Kimura et al. ............ 310/313 B

FOREIGN PATENT DOCUMENTS

| JP | 2006-270906 A | 10/2006 |
| WO | 2010/016192 A1 | 2/2010 |
| WO | 2010/070816 A1 | 6/2010 |

OTHER PUBLICATIONS

Official Communication issued in International Patent Application No. PCT/JP2012/050764, mailed on Mar. 19, 2012.

* cited by examiner

*Primary Examiner* — Mark Budd
(74) *Attorney, Agent, or Firm* — Keating & Bennett, LLP

(57) ABSTRACT

A surface acoustic wave device includes a piezoelectric substrate made of lithium niobate and including grooves in a surface thereof. Each groove includes a finger of an IDT electrode made of copper. The IDT electrode includes a first electrode layer embedded in the grooves and a second electrode layer sticking out of the surface of the piezoelectric substrate. A normalized electrode thickness of the first electrode layer is about 1.0% to about 12.0% inclusive, and the normalized electrode thickness of the second electrode layer is about 1.0% to about 9.0% inclusive. The normalized electrode thickness of the entire IDT electrode is about 6.0% to about 13.0% inclusive.

10 Claims, 10 Drawing Sheets

$1.0\% \leqq D_o \leqq 9.0\%$
$1.0\% \leqq D_i \leqq 12.0\%$
$6.0\% \leqq D(=D_o+D_i) \leqq 13.0\%$

SURFACE ACOUSTIC WAVE DEVICE

BACKGROUND OF THE INVENTION

1. Field of the Invention

The present invention relates to a surface acoustic wave device including a piezoelectric substrate and interdigital transducer (IDT) electrodes on a surface of the piezoelectric substrate.

2. Description of the Related Art

Hitherto researchers have created various surface acoustic wave devices that have a piezoelectric substrate and an IDT electrode on the surface of the piezoelectric substrate. For example, Japanese Unexamined Patent Application Publication No. 2006-270906 discloses a surface acoustic wave device that has a piezoelectric substrate and a plurality of electrode fingers partially embedded in the thickness direction so as to stick out or protrude from the surface.

Japanese Unexamined Patent Application Publication No. 2006-270906 mentions that various known piezoelectric substrates and materials for electrode fingers can be used, and also specifies the required depth of grooves in which the electrode fingers are formed and the required uniformity of the thickness of the electrode fingers.

Selecting the material for the electrode fingers and the depth of the grooves in accordance with the requirements specified in Japanese Unexamined Patent Application Publication No. 2006-270906, however, can lead to poor characteristics of the surface acoustic wave device because the performance parameters of the device, e.g., the band width ratio, the resonance Q factor, and the spurious characteristics, vary with the combination of the material for the piezoelectric substrate and that for the electrode fingers.

SUMMARY OF THE INVENTION

Preferred embodiments of the present invention provide a surface acoustic wave device that provides improved characteristics and is easily manufactured with selected combinations of materials.

According to a preferred embodiment of the present invention, a surface acoustic wave device includes a piezoelectric substrate with grooves located in a surface thereof and an IDT electrode including a first electrode layer located in the grooves and a second electrode layer outside of the grooves. The piezoelectric substrate is made of lithium niobate. The IDT electrode, which includes the first and second electrode layers, is made of copper or a metal based on copper or an alloy containing copper as the major component. An IDT electrode can be described as being based on copper when copper accounts for more than 50% by weight of the entire IDT electrode. When a thickness of an electrode normalized by the wave length of surface acoustic waves is defined as a normalized electrode thickness, the IDT electrode is constructed such that the normalized electrode thickness values Do and Di of the second and first electrode layers, respectively, satisfy the following relations (i), (ii), and (iii):

$$1.0\% \leq Do \leq 9.0\% \quad \text{(i)}$$

$$1.0\% \leq Di \leq 12.0\% \quad \text{(ii)}$$

$$6.0\% \leq (Do+Di) \leq 13.0\% \quad \text{(iii)}$$

This configuration increases the acoustic velocity of the resulting elastic waves, keeps the band width ratio of the elastic waves high, and reduces spurious waves.

In a preferred configuration of the surface acoustic wave device according to a preferred embodiment of the present invention, Euler Angles of the piezoelectric substrate are ($\phi=0°\pm5°$, $80°\leq\theta\leq110°$, $\psi=0°\pm5°$).

This configuration further cuts down on Rayleigh waves, which cause of spurious waves.

In another preferred configuration of the surface acoustic wave device according to a preferred embodiment of the present invention, an aperture area of the grooves of the piezoelectric substrate becomes smaller as the area gets deeper under the surface, and an angle $\alpha$ between the surface and lateral surfaces of the grooves satisfies a relation $50°\leq\alpha\leq70°$.

This configuration further increases the band width ratio of the resulting elastic waves.

In yet another preferred configuration of the surface acoustic wave device according to a preferred embodiment of the present invention, a silicon oxide film is arranged on the piezoelectric substrate to cover the IDT electrode, and a surface of the silicon oxide film opposite to the piezoelectric substrate is flat or substantially flat.

This configuration improves the frequency-temperature characteristics of the surface acoustic wave device.

In a different preferred configuration of the surface acoustic wave device according to a preferred embodiment of the present invention, a thickness of the silicon oxide film normalized by a wave length of the surface acoustic waves propagating on the surface acoustic wave device falls within a range of about 5% to about 35%, for example.

This configuration further improves the frequency-temperature characteristics of the surface acoustic wave device.

Various preferred embodiments of the present invention provide a surface acoustic wave device that has excellent characteristics and can be easily manufactured.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
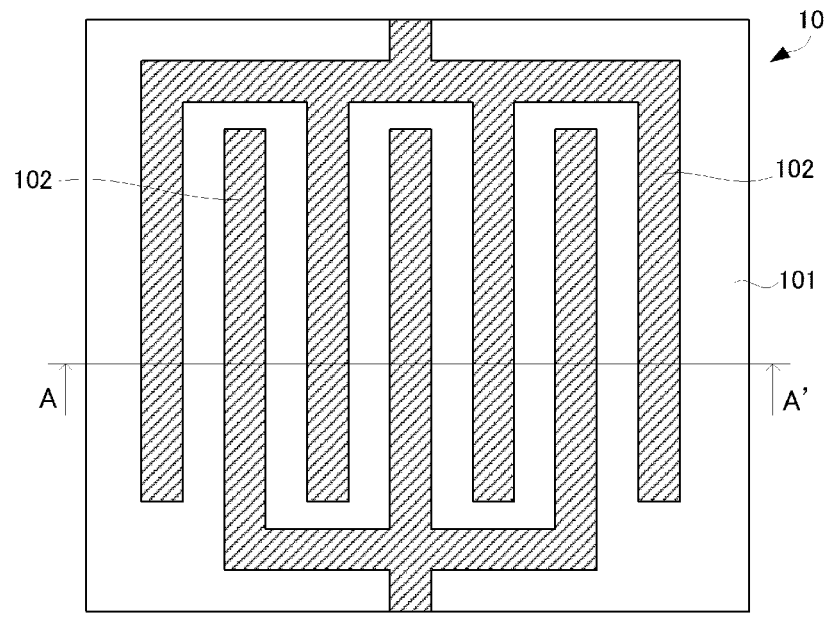
FIGS. 1A-1C are a plan view, a side cross-sectional view, and an enlarged partial view of the side cross-section of a one-port resonator that is a surface acoustic wave device according to a preferred embodiment of the present invention.
Figure 1B:
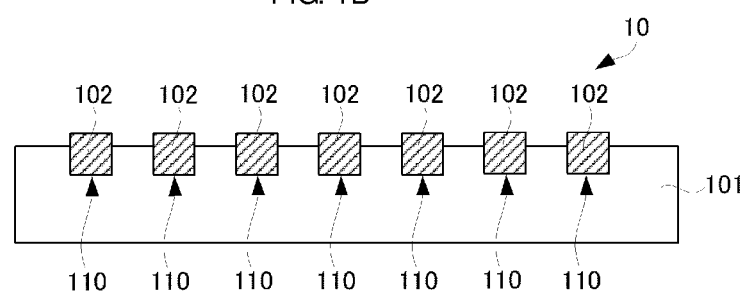
Figure 1C:
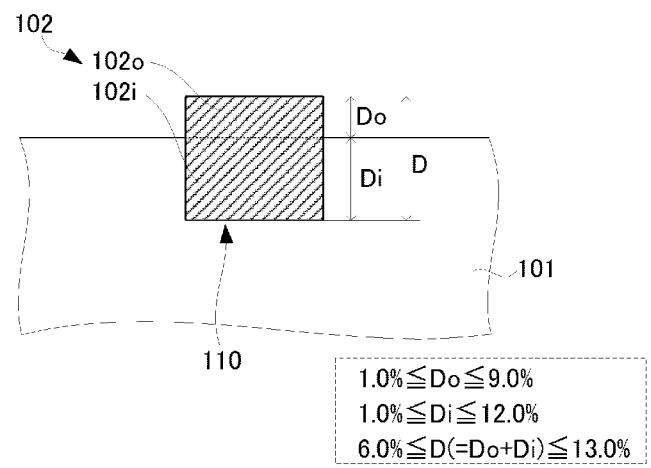

The following describes a surface acoustic wave device according to a preferred embodiment of the present invention with reference to drawings. FIG. 1A is a plan view of a one-port resonator that is a surface acoustic wave device according to present preferred embodiment, FIG. 1B is a side cross-sectional view taken along line A-A' of FIG. 1A, and FIG. 1C is an enlarged partial view of the side cross-section. Note that a one-port resonator is not the only possible preferred embodiment of the acoustic wave device according to the present invention; for example, the acoustic wave device according to the present invention may also be a surface acoustic wave filter.

A surface acoustic wave device 10 includes a plate-shaped piezoelectric substrate 101. The piezoelectric substrate 101 preferably is made of lithium niobate ($LiNbO_3$). The piezoelectric substrate 101 preferably is a "Y-cut" substrate, i.e., the cut surface and the direction of the propagating elastic waves are defined by Euler Angles (0°, 90°, 0°).

An IDT electrode 102, i.e., a pair of interdigital comb electrodes, is located on the piezoelectric substrate 101. The surface acoustic wave device 10 performs the functions of the surface acoustic wave device 10 by exciting elastic waves at the IDT electrode 102 and propagating the elastic waves on the surface of the piezoelectric substrate 101 as surface acoustic waves.

As illustrated in FIGS. 1A-1C, the IDT electrode 102 included in the present preferred embodiment includes a stack of a first electrode layer 102i and a second electrode layer 102o.

The first electrode layer 102i is located in grooves 110 cut into the surface of the piezoelectric substrate 101. The first and second electrode layers 102i and 102o are individually made of Cu.

The first and second electrode layers 102i and 102o may be made of a Cu alloy instead of pure Cu as long as the major component is Cu. The IDT electrode 102 can be described as containing Cu as the major component when Cu accounts for more than 50% by weight of the entire IDT electrode. For example, when the IDT electrode 102 is made from a monolayer metal film, this metal film is made of Cu or an alloy containing Cu as the major component. An alloy can be described as containing Cu as the major component when the alloy contains Cu in a weight ratio of more than 50% by weight. Ti, Ni, NiCr, Ta, or a similar material may be interposed in the form of an interface layer between the piezoelectric substrate and Cu. It is also possible to provide a metal other than Cu or an insulating film for frequency adjustment on the upper surface side, for example, or to use a laminated structure like Cu/Ti/Cu/Ti/Cu/Ti . . . as long as the main material is Cu.

The pitch of the IDT electrode 102 is preferably set to be equal to the wave length λ of the propagating elastic waves. This wave length λ is determined by the frequency of the propagating elastic waves and the phase velocity (acoustic velocity) described later herein.

The IDT electrode 102 preferably has a width of about ¼ of the wave length λ of the elastic waves.

Such a configuration allows the device to excite surface acoustic waves, mainly SH waves, propagating perpendicularly to the direction in which the fingers of the IDT electrode 102 extend.

The IDT electrode 102 is arranged such that the thickness thereof satisfies formulae 1, 2, and 3 presented below. The thickness mentioned here includes the actual mean thickness measurements of the IDT electrode 102 normalized by the wave length λ of the elastic waves (normalized electrode thickness values (%)). The normalized electrode thickness of the second electrode layer 102o, which is the portion of the IDT electrode 102 sticking out of the piezoelectric substrate 101, is denoted by Do, and that of the first electrode layer 102i, which is the portion embedded in the grooves 110, is denoted by Di. The total thickness of the IDT electrode 102 is denoted by D (=Do+Di).

$$1.0\% \leq Do \leq 9.0\% \quad \text{(Formula 1)}$$

$$1.0\% \leq Di \leq 12.0\% \quad \text{(Formula 2)}$$

$$6.0\% \leq D \leq 13.0\% \quad \text{(Formula 3)}$$

Forming the IDT electrode 102 to have such measurements provides advantages including those described later herein.

The first and second electrode layers 102i and 102o may be prepared by forming the first electrode layer 102i and then the second electrode layer 102o in a seamless manner or forming the second electrode layer 102o in a separate operation after the first electrode layer 102i has been formed. In this preferred embodiment, the first electrode layer 102i and then the second electrode layer 102o are preferably formed in a seamless manner. In other words, the first electrode layer 102i and the second electrode layer 102o are integral with each other so as to be defined by a single unitary member.

Figure 2:
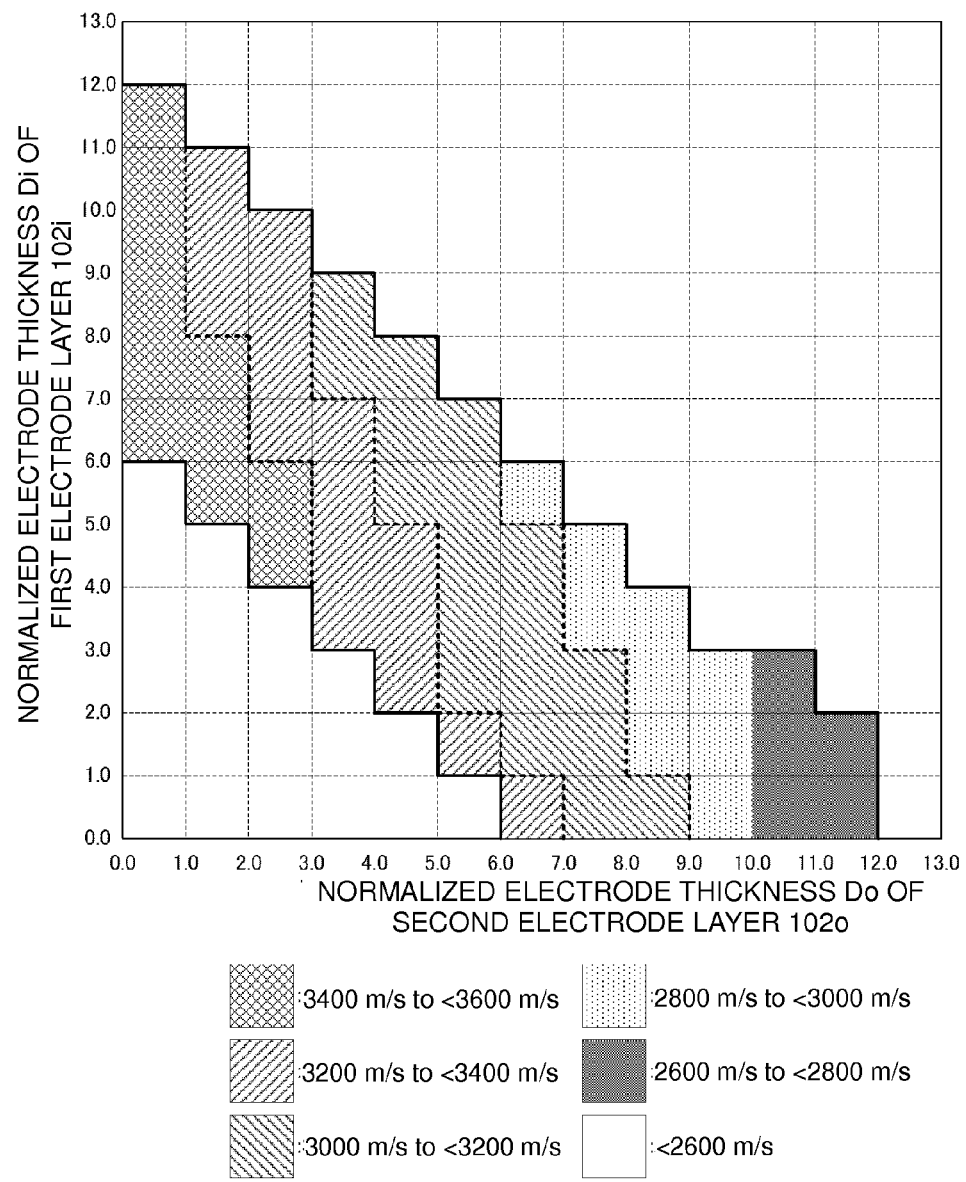
FIG. 2 is a map showing the behavior of acoustic velocity as a function of the normalized electrode thickness values Do and Di of the second and first electrode layers 102o and 102i, respectively.

FIG. 2 is a map showing the behavior of acoustic velocity as a function of the normalized electrode thickness values Do and Di of the second and first electrode layers 102o and 102i, respectively.

Figure 3A:
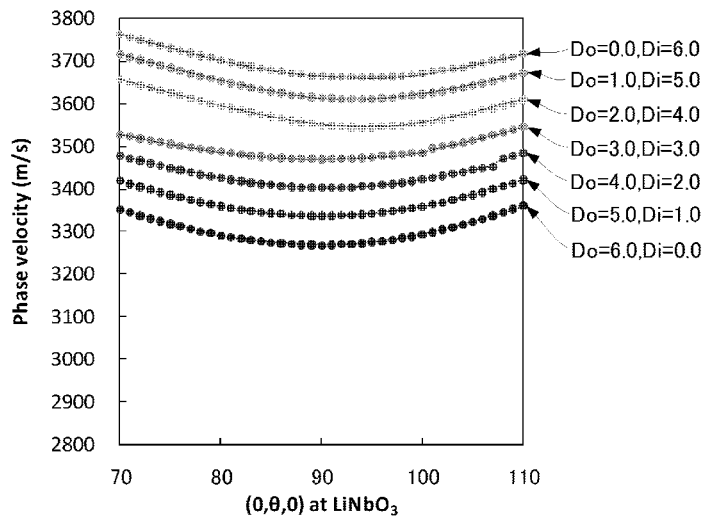
FIGS. 3A-3C are plots of acoustic velocity against the Euler Angle $\theta$, varying from 70° to 110°, for a normalized electrode thickness D equal to 6%, 7%, or 8%.
Figure 3B:
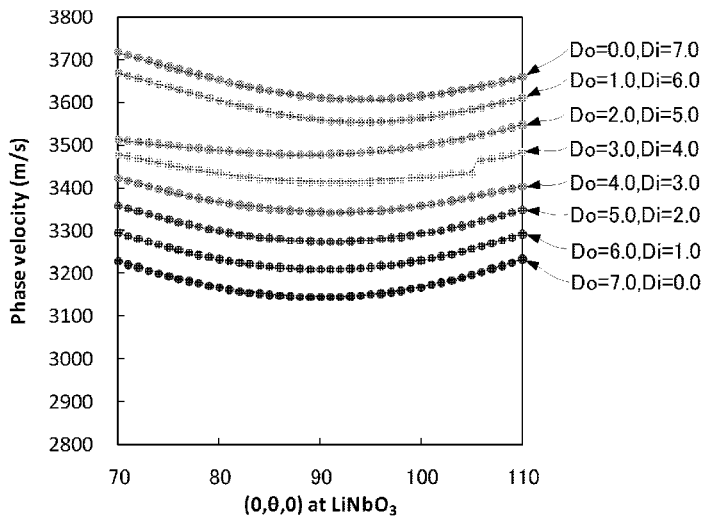
Figure 3C:
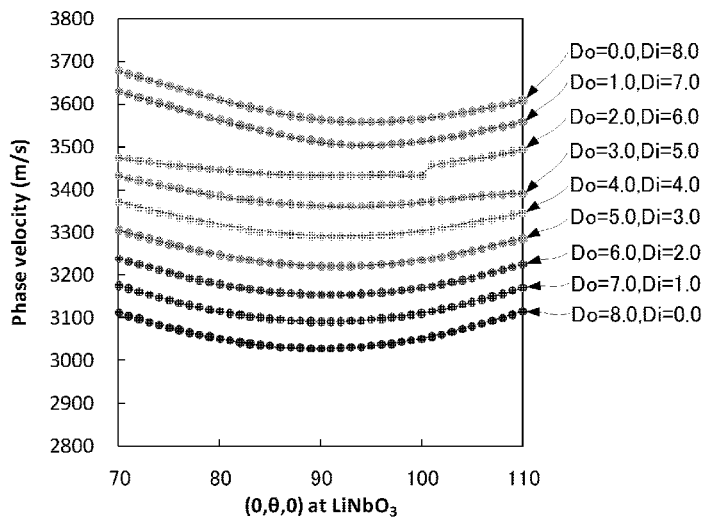
Figure 4A:
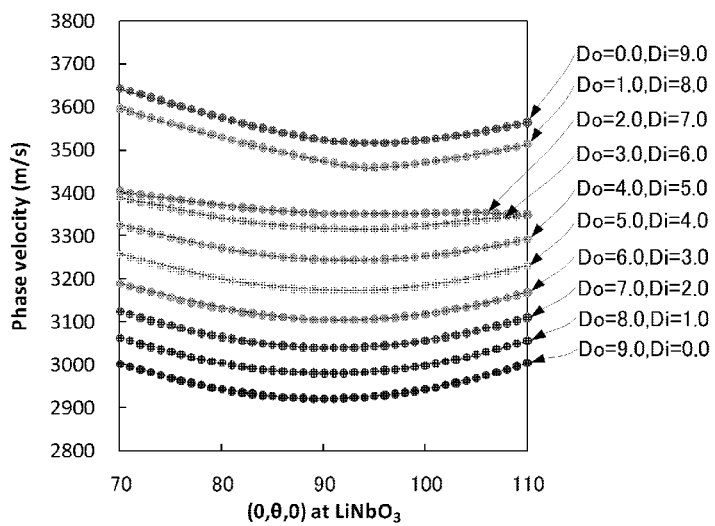
FIGS. 4A-4C are plots of acoustic velocity against the Euler Angle $\theta$, varying from 70° to 110°, for a normalized electrode thickness D equal to 9%, 10%, or 11%.
Figure 4B:
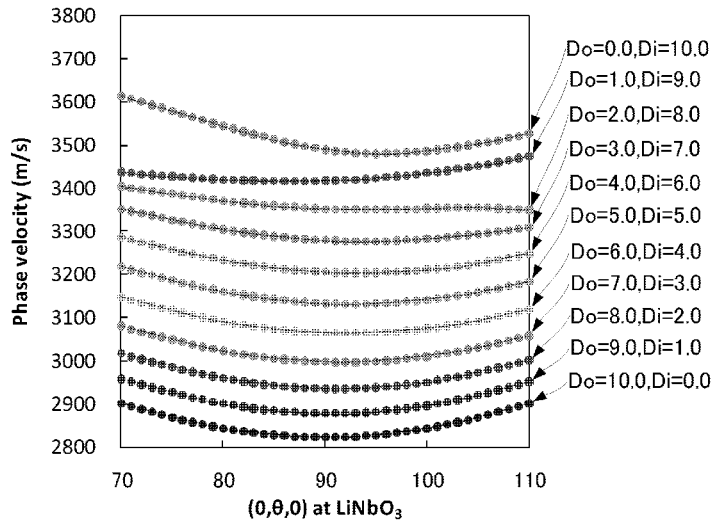
Figure 4C:
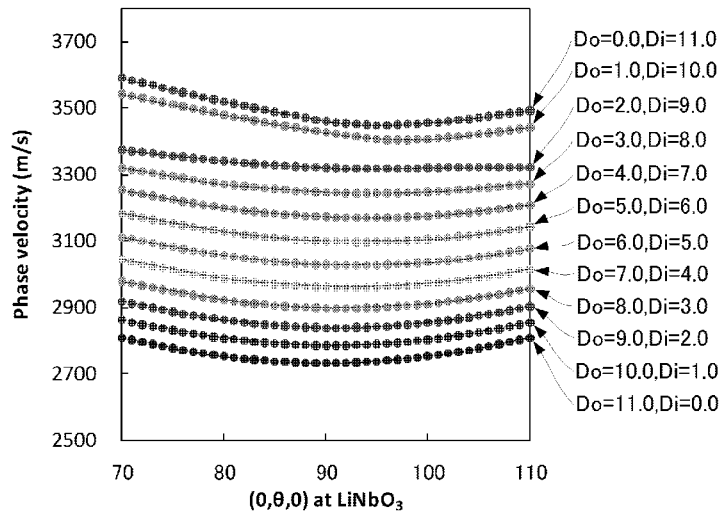
Figure 5A:
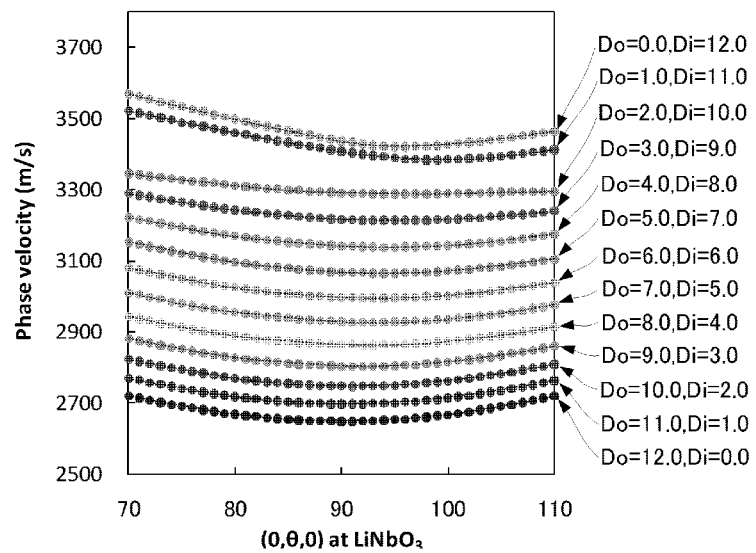
FIGS. 5A and 5B are plots of acoustic velocity against the Euler Angle $\theta$, varying from 70° to 110°, for a normalized electrode thickness D equal to 12% or 13%.
Figure 5B:
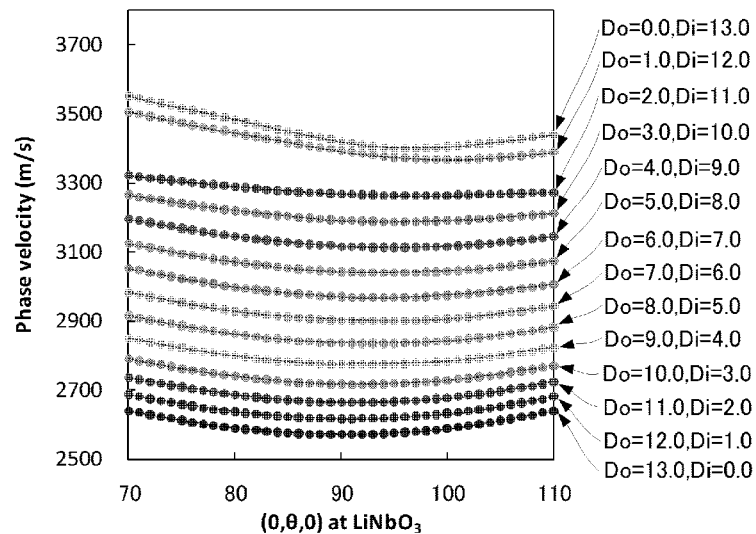

FIGS. 3A to 5B include plots of acoustic velocity against the Euler Angle θ, varying from about 70° to about 110°, for example, for a certain normalized electrode thickness D. The normalized electrode thickness D was varied from about 6% to about 13%, for example. In FIGS. 3A, 3B, and 3C the normalized electrode thickness D is 6%, 7%, and 8%, respectively. In FIGS. 4A, 4B, and 4C, the normalized electrode thickness D is 9%, 10%, and 11%, respectively. In FIGS. 5A and 5B, the normalized electrode thickness D is 12% and 13%, respectively. The illustrated results are from a simulation using the finite element method.

As shown in FIGS. 2 to 5B, the acoustic velocity is at least about 2600 m/s when the thickness values satisfy the conditions defined by formulae (1), (2), and (3) above. In particular, when the normalized electrode thickness Do of the second electrode layer 102o is about 10% or less, the acoustic velocity is about 2800 m/s or more, for example.

Since high acoustic velocities are allowed in this way, the upper limit of the wave length λ for a fixed frequency is extended from that with lower acoustic velocities. This means that the pitch of the IDT electrode can be expanded. As a result, the manufacturing yield can be improved. Drops in electric power handling capability or anti-electrostatic properties due to a short circuit between the electrodes or other defects can also be prevented, so as to make it possible to produce a highly reliable device.

For example, when a surface acoustic wave device 1 is made in accordance with the aforementioned conditions, the acoustic velocity is at least about 2600 m/s, and thus high-frequency waves of about 2.6 GHz can be propagated with a wave length λ as small as about 1 μm, i.e., the minimum width of the electrode 102 required to achieve this frequency is about 0.25 μm, for example. In particular, when the normalized electrode thickness Do of the second electrode layer 102o is about 10% or less, the acoustic velocity is about 2800 m/s or more, and high-frequency waves of about 2.8 GHz can be propagated with a wave length λ as small as about 1 μm, i.e., the minimum width of the electrodes 102 required to achieve this higher frequency is about 0.25 μm, for example.

In i-line and KrF-line photolithography, which are processes commonly used in the production of SAW devices today, the smallest electrode width that can be achieved is about 0.25 μm (a wave length λ of about 1 μm). This means that SAW devices for high frequencies like the above one can be easily manufactured by a current standard process for producing SAW devices.

More specifically, UMTS-BAND 7 (2.6 GHz) or LTE-Band Class 13 (2.8 GHz) surface acoustic wave devices, which use the highest frequency band demanded of SAW filters and other SAW devices, can be manufactured by an ordinary and conventional production process. In other words, the surface acoustic wave device according to the present preferred embodiment eliminates the conventional need for special and expensive production systems in the production of such devices. Furthermore, the produced surface acoustic wave devices are highly reliable despite such high frequencies.

Note that in some of the results of a simulation illustrated in FIGS. 2, 3A-3C, 4A-4C, 5A and 5B above, the normalized electrode thickness Do of the second electrode layer 102o is 0% or the normalized electrode thickness Di of the first electrode layer 102i is 0%. In other words, some of the illustrated results are from devices in which the IDT electrode 102 is completely inside the piezoelectric substrate 101 or the entire IDT electrode 102 is on the flat surface of the piezoelectric substrate 101. Under these conditions, however, the use of the device should be limited for reasons such as the following.

Figure 6:
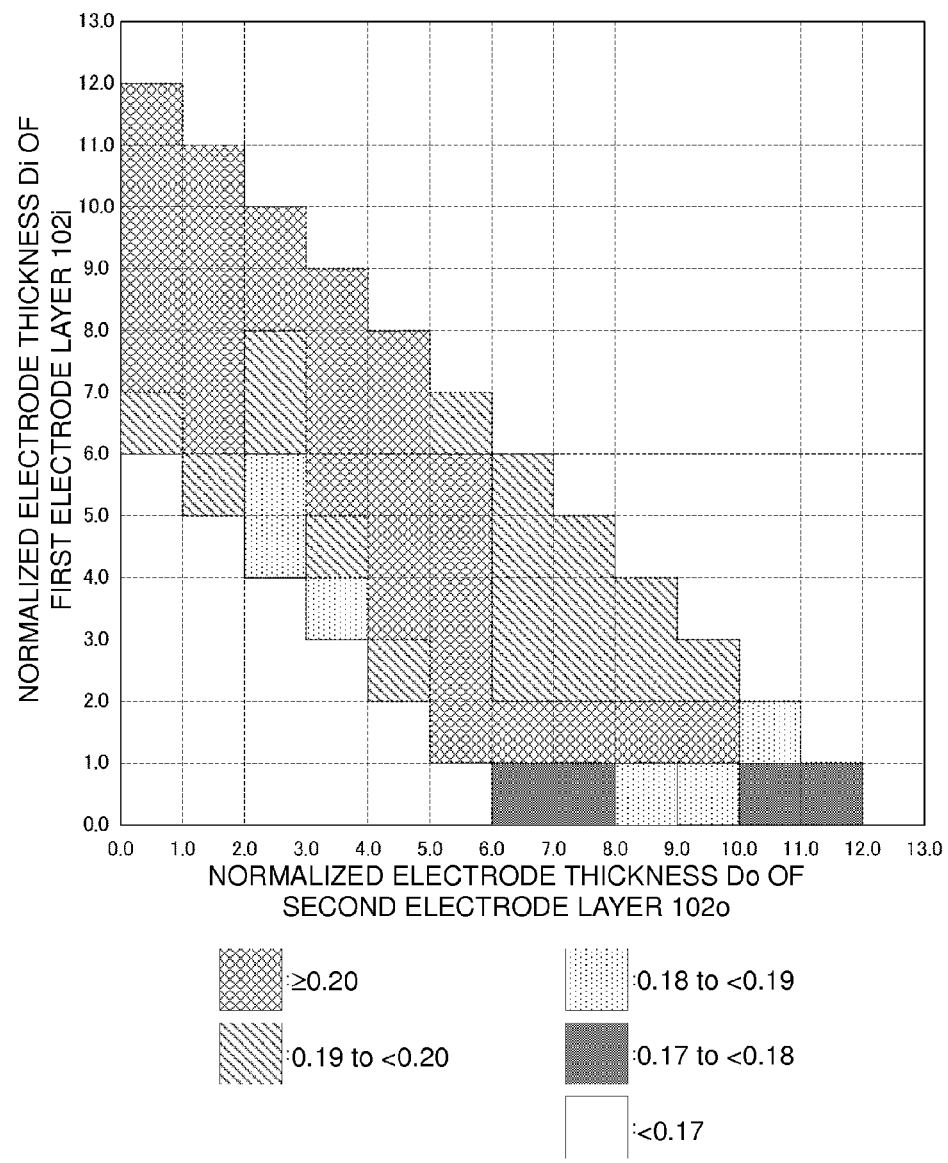
FIG. 6 is a map showing the behavior of the band width ratio of SH (shear horizontal) waves as a function of the normalized electrode thickness values Do and Di of the second and first electrode layers 102o and 102i, respectively.

FIG. 6 is a map showing the behavior of the band width ratio of SH waves as a function of the normalized electrode thickness values Do and Di of the second and first electrode layers 102o and 102i, respectively.

The band width ratio and the electromechanical coupling coefficient of a surface acoustic wave device are correlated with each other; the higher the band width ratio is, the higher the electromechanical coupling coefficient is. The band width ratio is a normalized band width of a resonator incorporating this surface acoustic wave device and is calculated by dividing the width of the range from the anti-resonant frequency to the resonant frequency, i.e., the difference between the anti-resonant and resonant frequencies, by the resonant frequency. The higher the band width ratio is, the broader the frequency band the surface acoustic wave device can use is.

As shown in FIG. 6, when the normalized electrode thickness Di of the first electrode layer 102i is 0%, the band width ratio is smaller than when the normalized electrode thickness Di of the first electrode layer 102i is about 1% or more, regardless of the normalized electrode thickness Do of the second electrode layer 102o. In other words, forming the IDT electrode 102 on the surface of the piezoelectric substrate 101 results in a smaller band width ratio than embedding the IDT electrode 102 at least partially to a predetermined depth under the surface of the piezoelectric substrate 101. Thus, a structure in which the normalized electrode thickness Di of the first electrode layer 102i is about 1.0% or more (1.0% Di), i.e., a structure in which the IDT electrode 102 is at least partially embedded to a predetermined depth under the surface of the piezoelectric substrate 101, provides a surface acoustic wave device with improved characteristics. In particular, setting the normalized electrode thickness Do of the second electrode layer 102o at about 10% or less ensures that the band width ratio of SH waves is about 0.18 (about 18%), for example, with any combination of thickness measurements including the conditions specified above, so as to further improve the characteristics of the surface acoustic wave device.

Figure 7A:
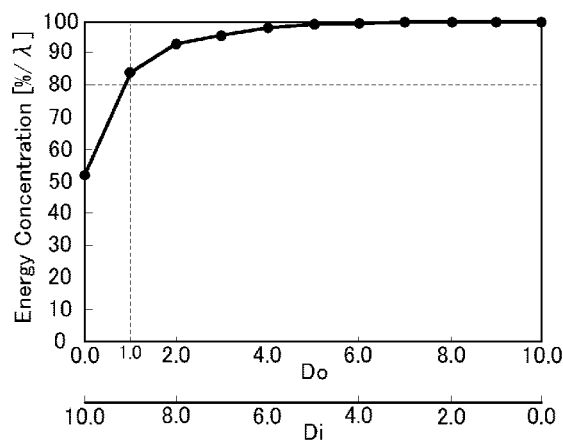
FIGS. 7A-7C are plots of the energy concentration, i.e., the percentage of the surface acoustic wave energy within a depth of 1λ under the surface of the piezoelectric substrate 101 to all excited energy, against the proportions of the normalized electrode thickness values Do and Di of the second and first electrode layers 102o and 102i, respectively, equal to 10%, 8%, or 12%.
Figure 7B:
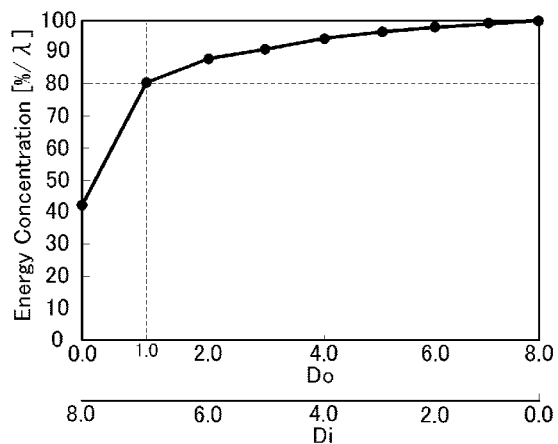
Figure 7C:
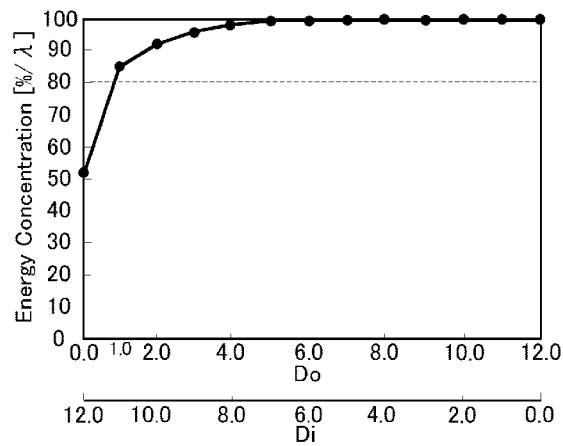

FIGS. 7A-7C are plots of the energy concentration of a one-port SAW resonator described later herein. With the normalized electrode thickness D at 10%, 8%, or 12%, these plots show the percentage of the surface acoustic wave energy within a depth of 1λ under the surface of the piezoelectric substrate 101 to all energy excited at the anti-resonance point against the proportions of the normalized electrode thickness values Do and Di of the second and first electrode layers 102o and 102i, respectively. In FIGS. 7A, 7B, and 7C, the normalized electrode thickness D is 10%, 8%, and 12%, respectively.

As shown in FIGS. 7A-7C, when the normalized electrode thickness Do of the second electrode layer 102o is 0%, the energy concentration is much smaller than when the normalized electrode thickness Do of the second electrode layer 102o is about 1% or more, regardless of the normalized electrode thickness D. This means that near the anti-resonance point, energy leaks in the direction of the depth of the piezoelectric substrate and there is a great propagation loss of surface acoustic waves. The energy concentration is 80 or more particularly when the normalized electrode thickness Do of the second electrode layer 102o is about 1% or more; in such a case, surface waves can be produced efficiently.

Although not illustrated, similar characteristics can be achieved whatever the normalized electrode thickness D as long as the normalized electrode thickness D is in the range of about 6% to about 13%, both inclusive ($6.0\% \leq D \leq 13.0\%$), for example.

In this way, a configuration in which the normalized electrode thickness Do of the second electrode layer 102o is about 1% or more ($1.0\% \leq Do$), i.e., a structure in which the IDT electrode 102 at least partially sticks out of the surface of the piezoelectric substrate 101 with the exposed thickness at about 1% or more, provides a surface acoustic wave device with improved characteristics.

Figure 8:
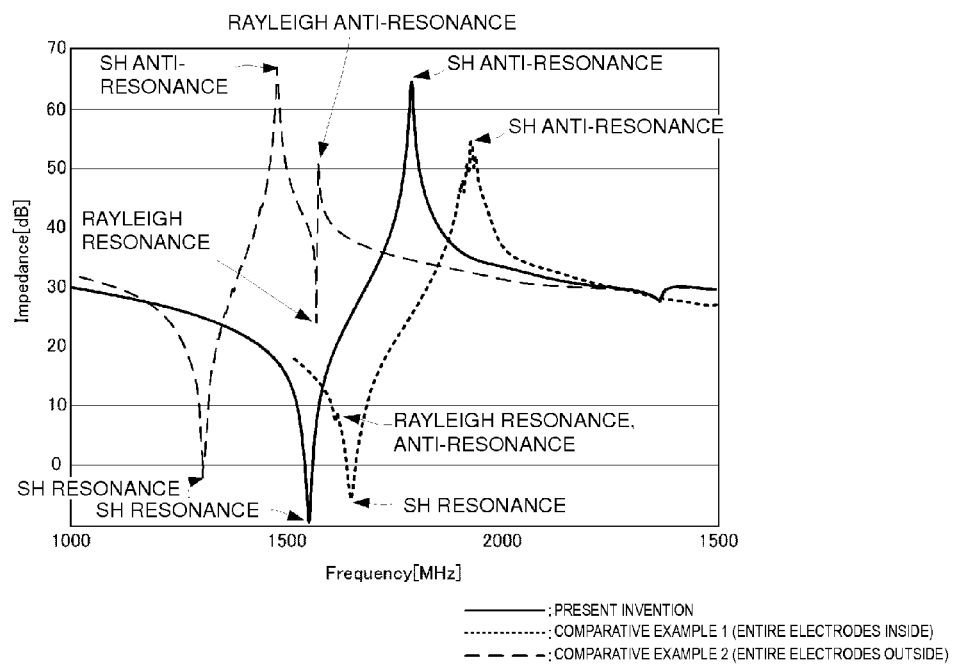
FIG. 8 illustrates the impedance characteristics of one-port SAW resonators one of which is according to this preferred embodiment, another is Comparative Example 1, i.e., a structure in which the entire electrodes 102 are embedded, and yet another is Comparative Example 2, i.e., a structure in which the electrodes 102 are on the surface.

FIG. 8 illustrates the impedance characteristics of one-port SAW resonators one of which is according to this preferred embodiment, another is Comparative Example 1, which is a structure in which the entire IDT electrode 102 is embedded, and yet another is Comparative Example 2, which is a structure in which the IDT electrode 102 is on the surface. In FIG. 8, the normalized electrode thickness D is about 10%, and the configuration according to this preferred embodiment is one in which the normalized electrode thickness Do of the second electrode layer 102o is about 8% and the normalized electrode thickness Di of the first electrode layer 102i is about 2%, for example.

As shown in FIG. 8, Comparative Example 1, i.e., a structure in which the entire IDT electrode 102 is embedded, is of low steepness at the anti-resonance point for SH waves. This is because, as described above, near the anti-resonance point the concentration of surface acoustic wave energy is low and energy leaks in the direction of the depth of the piezoelectric substrate. This makes the impedance at the anti-resonance point lower and the impedance ratio of the anti-resonance point to the resonance point (width of the range from the maximum to the minimum) smaller, so as to affect the characteristics of the resonator.

With regard to Comparative Example 2, which is a structure in which the IDT electrode 102 is on the surface, the response to Rayleigh waves is very high and the resonance and anti-resonance with Rayleigh waves are strong. As is also seen from FIGS. 3, 4, and 5, the frequency is extremely low compared with that in this preferred embodiment or Comparative Example 1; this resonator is more difficult to manufacture than the others because a shorter wave length is required to achieve the same frequency. Furthermore, the band width ratio, or the difference between the anti-resonant frequency and the resonant frequency, is small; thus, this structure fails to provide a wideband surface acoustic wave device.

In contrast, the configuration according to this preferred embodiment causes little response to Rayleigh waves and no resonance or anti-resonance with Rayleigh waves. The width of the range from the maximum to the minimum at the resonance and anti-resonance points for SH waves is larger than that in Comparative Example 1, so as to eliminate the influence of other spurious waves. Furthermore, the band width ratio is higher than that in Comparative Example 2, ensuring excellent resonance characteristics.

Although not illustrated, similar characteristics can be achieved when the normalized electrode thickness D is in the range of about 6% to about 13%, both inclusive (6.0%≤D≤13.0%), for example, and the normalized electrode thickness values Do and Di of the second and first electrode layers 102o and 102i, respectively, are both about 1% or more, for example.

In this way, the configuration described in this preferred embodiment provides a surface acoustic wave device having excellent characteristics such as a sufficiently high electromechanical coupling coefficient, excellent resonance characteristics, and reduced spurious waves including Rayleigh waves.

Although the foregoing description focuses on cases where the Euler Angle θ preferably is about 90°, similar advantages can be achieved when the Euler Angle θ is in a particular range. Good characteristics of the device are ensured when this angle falls within the range specified below in particular.

Figure 9:
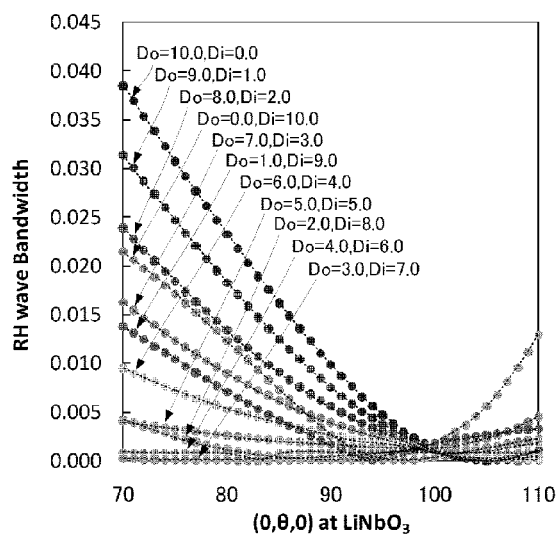
FIG. 9 shows plots of the band width ratio of Rayleigh waves against the Euler Angle θ, varying from 70° to 110°, for different proportions of the normalized electrode thickness values Do and Di of the second and first electrode layer 102o and 102i, respectively. The normalized electrode thickness D is 10%.

FIG. 9 shows plots of the band width ratio of Rayleigh waves against the Euler Angle θ, varying from about 70° to about 110°, for example, for different proportions of the normalized electrode thickness values Do and Di of the second and first electrode layer 102o and 102i, respectively. The normalized electrode thickness D is about 10%, for example.

As shown in FIG. 9, the band width ratio of Rayleigh waves has a minimum in the Euler Angle θ range of, for example, about 80° to about 110°, both inclusive, regardless of the proportions of the normalized electrode thickness values Do and Di of the second and first electrode layers 102o and 102i, respectively.

Although in FIG. 9 the normalized electrode thickness D preferably is about 10%, similar advantages can also be achieved with other values for the normalized electrode thickness D including those specified by the aforementioned conditions for the configuration according to this preferred embodiment.

In summary, a surface acoustic wave device can be obtained with further reduced spurious Rayleigh waves and further improved characteristics when the Euler Angle θ is in the range of, for example, about 80° to about 110°, both inclusive, while the aforementioned conditions are satisfied.

Figure 10:
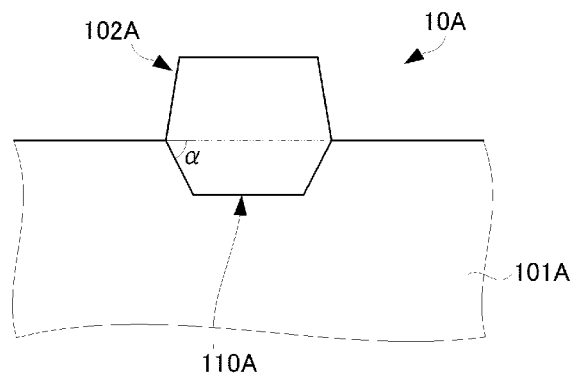
FIG. 10 is an enlarged partial side view of a surface acoustic wave device 10A according to another configuration of a preferred embodiment of the present invention.

Although in the above description the lateral surfaces of the grooves 110 and those of the IDT electrode 102 are preferably at an angle of about 90° relative to the surface of the piezoelectric substrate 101, it is also possible to use grooves 110A and IDT electrode 102A illustrated in FIG. 10.

FIG. 10 is an enlarged partial side view of a surface acoustic wave device 10A according to another configuration of a preferred embodiment of the present invention.

The surface acoustic wave device 10A according to another configuration of this preferred embodiment is such that the lateral surfaces of the grooves 110A and those of the first electrode layer of the IDT electrode 102A are at an angle of α and not at about 90° relative to the surface of a piezoelectric substrate 101A. The angle α is selected so as to ensure that the plane area of the grooves 110A and the IDT electrode 102A is smaller at the bottom (at the deepest level) than at the level of the surface of the piezoelectric substrate 101A. In other words, in a side view as in FIG. 10, the lateral surfaces of the embedded portion of the IDT electrode 102A define an angle α of less than about 90° with the surface of the piezoelectric substrate 101A inside the electrode 102A. In particular, setting the angle α in the range of about 50° to about 70°, for example, both inclusive, leads to further improvement in characteristics.

Figure 11:
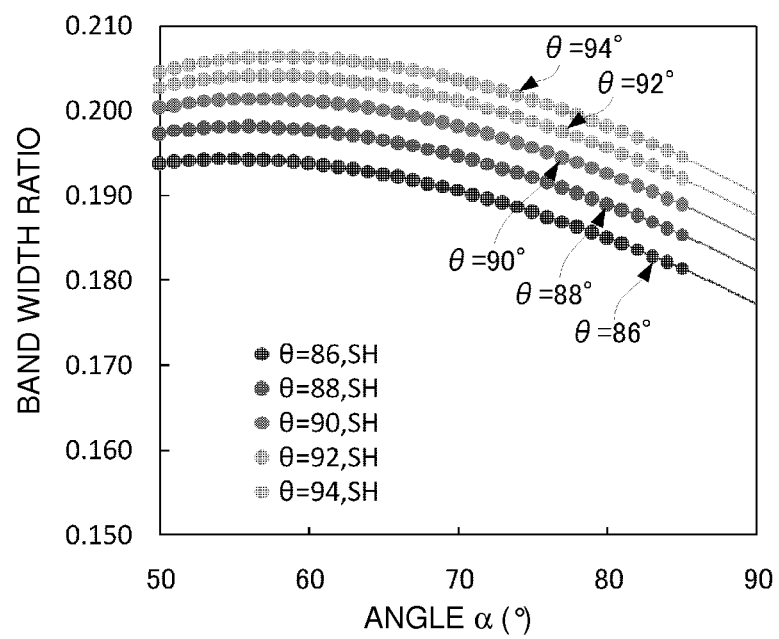
FIG. 11 is a characteristic diagram showing plots of the band width ratio of SH waves as a function of the angle α made by the lateral surfaces of the grooves cut into the surface of the piezoelectric substrate and the Euler Angle θ.

FIG. 11 is a characteristic diagram showing plots of the band width ratio of SH waves as a function of the angle α and the Euler Angle θ. In FIG. 11 the angle α is in the range of about 50° to about 90°, both inclusive, and the Euler Angle θ is about 86°, about 88°, about 90°, about 92°, or about 94°, for example. FIG. 11 is for a device in which the normalized electrode thickness Do of the second electrode layer 102o is about 2% and the normalized electrode thickness Di of the first electrode layer 102i is about 8%, for example.

As shown in FIG. 11, the band width ratio of SH waves peaks at an angle α in the range from about 50° to about 70°, both inclusive, and decreases as the angle exceeds about 70° and approaches about 90°, for example. Although not illustrated, a trend similar to this is observed with any Euler Angle θ in the range of, for example, about 80° to about 110°, both inclusive.

Thus, a surface acoustic wave device can be obtained with a higher band width ratio of SH waves and better characteristics when the angle α satisfies the relation 50°≤α≤70° than with other angles.

Although the above description does not discuss Euler Angles φ and ψ in detail, the advantages described above can be achieved when these angles are in the range of about ±5°, i.e., when −5°≤φ≤5° and −5°≤ψ≤+5°, for example.

Figure 12:
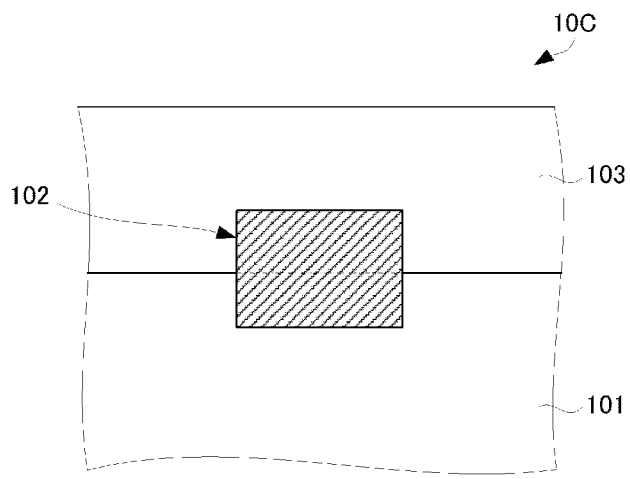
FIG. 12 is an enlarged partial side view of a surface acoustic wave device 10B including an upper layer film 103.

It is also possible to provide an upper layer film made of silicon oxide (SiO$_2$) or a similar material to cover the IDT electrode. FIG. 12 is an enlarged partial side view of a surface acoustic wave device 10B including an upper layer film 103. As illustrated in FIG. 12, the surface acoustic wave device 10B includes an upper layer film 103 made of silicon oxide (SiO$_2$) or a similar material on the surface on the IDT electrode 102 side of the piezoelectric substrate 101. Such a configuration improves the frequency-temperature characteristics of the surface acoustic wave device.

Figure 13:
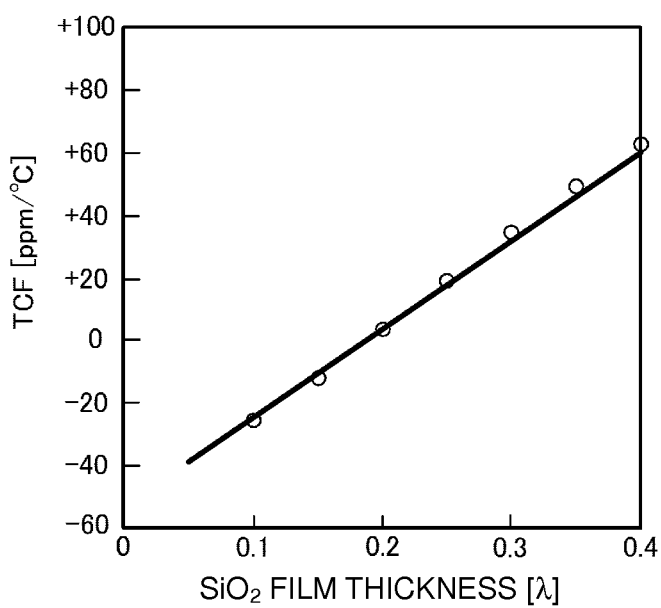
FIG. 13 is a graph showing the relation between the thickness of a $SiO_2$ film normalized by the wave length of surface acoustic waves and frequency-temperature characteristics (temperature coefficient of frequency, TCF).

FIG. 13 is a graph showing the relation between the thickness of a SiO$_2$ film normalized by the wave length of surface acoustic waves and frequency-temperature characteristics (temperature coefficient of frequency, TCF). This graph was created as described below.

Devices having the structure illustrated in FIG. 12 were prepared in which the second and first electrode layers 102o and 102i of the IDT electrode 102 had normalized electrode thickness values Do and Di of about 6% and about 2%, respectively, and the piezoelectric substrate 101 was made of lithium niobate with Euler Angles of (0°, 90°, 0°) with varying normalized thickness of a SiO$_2$ film (the upper layer film 103 in FIG. 12), and the TCF of the resulting devices was plotted. Experiments have confirmed that a trend similar to that in FIG. 13 is observed with any set of Euler Angles and thickness values of the IDT electrode within the scope of the present invention disclosed herein.

As is clear from FIG. 13, the TCF is improved as the SiO$_2$ film becomes thicker. More preferably, the normalized thickness of the SiO$_2$ film is in the range of about 5% to about 35%, for example. The TCF of a surface acoustic wave device satisfying this is better than that of one with no SiO$_2$ film.

Preferably, the surface of this SiO$_2$ film, i.e., the surface opposite to the piezoelectric substrate 101, is flat or substantially flat. This prevents damage to the characteristics of the surface acoustic wave device due to unintended consequences on the surface of the SiO$_2$ film such as reflection of surface acoustic waves because this film is highly smooth.

The SiO$_2$ film may be coated with a film for frequency adjustment. This frequency adjustment film is made of silicon nitride (SiN) or a similar material, for example. It is also possible to form a film made of silicon nitride (SiN) or a similar material between the IDT electrode and the SiO$_2$ film to block out moisture or prevent Cu contained in the IDT electrode from diffusing.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
   a piezoelectric substrate including grooves located in a surface thereof; and
   an IDT electrode including a first electrode layer in the grooves and a second electrode layer outside of the grooves; wherein:
   the piezoelectric substrate is made of lithium niobate;
   the first electrode layer and the second electrode layer are made of copper; and
   when a thickness of an electrode normalized by a wave length of surface acoustic waves is defined as a normalized electrode thickness, the normalized electrode thickness Do of the second electrode layer and the normalized electrode thickness Di of the first electrode layer satisfy relations:

$1.0\% \leq Do \leq 9.0\%$;

$1.0\% \leq Di \leq 12.0\%$; and $6.0\% \leq (Do+Di) \leq 13.0\%$.

2. The surface acoustic wave device according to claim 1, wherein Euler Angles of the piezoelectric substrate are ($\phi=0°\pm5°$, $80° \leq \theta \leq 110°$, $\psi=0°\pm5°$).

3. The surface acoustic wave device according to claim 1, wherein an aperture area of the grooves of the piezoelectric substrate becomes smaller as an area gets deeper under the surface, and an angle α between the surface and lateral surfaces of the grooves satisfies a relation:

$50° \leq \alpha \leq 70°$.

4. The surface acoustic wave device according to claim 1, further comprising:
   a silicon oxide film on the piezoelectric substrate, the silicon oxide film covering the IDT electrode; wherein
   a surface of the silicon oxide film opposite to the piezoelectric substrate is flat or substantially flat.

5. The surface acoustic wave device according to claim 4, wherein a thickness of the silicon oxide film normalized by a wave length of surface acoustic waves propagating on the surface acoustic wave device is within a range of about 5% to about 35%.

6. The surface acoustic wave device according to claim 1, wherein Euler Angles of the piezoelectric substrate are ($\phi=0°$, $\phi=90°$, $\psi=0°$).

7. The surface acoustic wave device according to claim 1, wherein the first electrode layer and the second electrode layer are made of copper alloy.

8. The surface acoustic wave device according to claim 1, further comprising an interface layer made of one of Ti, Ni, NiCr, and Ta and located between the piezoelectric substrate and the first electrode layer and the second electrode layer.

9. The surface acoustic wave device according to claim 4, further comprising a frequency adjustment film located on the silicon oxide film.

10. The surface acoustic wave device according to claim 9, wherein the frequency adjustment film is made of silicon nitride.